(12) United States Patent
Ueda

(10) Patent No.: US 7,236,405 B2
(45) Date of Patent: Jun. 26, 2007

(54) METHOD FOR SETTING ERASING PULSES AND SCREENING ERASING DEFECTS OF NONVOLATILE MEMORY

(75) Inventor: Naoki Ueda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 112 days.

(21) Appl. No.: 11/251,453

(22) Filed: Oct. 14, 2005

(65) Prior Publication Data
US 2006/0083073 A1 Apr. 20, 2006

(30) Foreign Application Priority Data
Oct. 14, 2004 (JP) ............... 2004-299574

(51) Int. Cl.
*G11C 11/34* (2006.01)
*G11C 16/04* (2006.01)
(52) U.S. Cl. .................. 365/185.29; 365/185.33; 365/185.3
(58) Field of Classification Search ........... 365/185.33, 365/185.29, 185.3, 185.01
See application file for complete search history.

(56) References Cited

U.S. PATENT DOCUMENTS 5,053,990 A 10/1991 Kreifels et al.
5,448,712 A * 9/1995 Kynett et al. .......... 711/103
6,646,926 B2 * 11/2003 Keays ................ 365/185.29

FOREIGN PATENT DOCUMENTS

JP 2-10596 A 1/1990

OTHER PUBLICATIONS

Mukherjee, S. et al. (1985). "A Single Transistor EEPROM Cell and its Implementation in a 512K CMOS EEPROM," *IEDM Technical Digest* 85:616-619.

* cited by examiner

Primary Examiner—Van Thu Nguyen
Assistant Examiner—Douglas King
(74) Attorney, Agent, or Firm—Morrison & Foerster LLP

(57) ABSTRACT

Method for determining the number of applications of erasing pulses, including extracting two pairs of the accumulated number of the erasing pulses Np and the ratio Re of the number of erased memory cells in the target block to be erased after the accumulated number of the erasing pulses Np has been applied, converting the two ratios Re into normalized variables S(Re) through normalizing the random variables of the normal distribution probability with standard deviations, converting the two accumulated numbers of the erasing pulses Np into common logarithms Log(Np), calculating a common logarithm Log(Nt) through extrapolating from two sets of coordinates [Log(Np), S(Re)], and determining the number of applications of the remaining erasing pulses so that the extrapolation erasing pulse number Nt is the target accumulated number of applications of erasing pulses.

8 Claims, 10 Drawing Sheets

METHOD FOR SETTING ERASING PULSES AND SCREENING ERASING DEFECTS OF NONVOLATILE MEMORY

CROSS REFERENCE TO RELATED APPLICATION

This Nonprovisional application claims priority under 35 U.S.C. §119(a) on Patent Application No. 2004-299574 filed in Japan on Oct. 14, 2004, the entire contents of which are hereby incorporated by reference.

BACKGROUND OF THE INVENTION

1. Field of the Invention

The present invention relates to a method for setting erasing pulse determining the number of or time for applications of the erasing pulses in a block erasing operation where a target block which consists mainly of a number of memory cells to be erased in a nonvolatile memory is erased by applying the erasing pulses plural times for erasing its block data together. Also, the present invention relates to a method for screening erasing defects in the nonvolatile memory and, more particularly, to a screening method capable of specifying defective memory cells which are slower in the erasing operation than the normally erased memory cells.

2. Description of the Related Art

A typical example of the nonvolatile memory is a flash erasable, electrically programmable read-only memory (flash EEPROM) including an electrically insulated MOS gate called a floating gate (see "A Single Transistor EEPROM Cell and Implementation in 512 k CMOS EEPROM" by S. Mukherjee et. al, IEDM Technical Digest, p. 616, 1985).

FIG. 1 illustrates a memory cell structure of such a conventional flash EPROM. The structure has a layer arrangement where the floating gate 1 is disposed to control directly a channel 2 and store data (electrons) and a control gate 4 is stacked over the floating gate 1 via an insulating layer 3. As apparent from an equivalent circuit shown in FIG. 2, the floating gate 1 is isolated from the external terminals by the insulating layer and its potential is controllably determined by capacitance coupling of the four external terminals. As the data writing operation is based on the mechanism of hot carrier phenomenon which is equal to the principle of writing operation on an ultraviolet ray erasable EPROM, it allows the electrons to be loaded with a higher level of energy than the barrier height of a tunnel gate oxide layer 5 serving as the insulating layer and injected in the floating gate 1. The erasing operation based on the mechanism of Fowler-Nordheim tunnel phenomenon involves releasing the electrons across the tunnel oxide layer 5 of an overlap region between the floating gate 1 and the source diffusion 6. This can control the number of electrons in the floating gate 1. The reading operation which is equal to that of a common NOR type MOS memory involves sensing a difference in the driving current for the accumulated data (the number of electrons) in each memory cell selectively activated through the bit line (drain 7) and the word line (control gate 4).

A conventional erasing operation for a nonvolatile memory involves applying an erasing voltage to a number of memory cells (bits) at once in a target block to be erased simultaneously. FIG. 3 is a flowchart showing a procedure of the erasing operation of a control circuit over the target block in a memory cell array.

The procedure starts with setting an erasing voltage generation circuit with a voltage condition for the erasing operation (step 301). A target block to be erased is selected (step 302). As the erasing pulses have been applied (step 303), unerased bits are counted at the erase verification level (reference threshold voltage for verification) (step 304). When the number of unerased bits is not zero (step 305), the procedure repeats a loop of the pulse applying operation in step 303 and the unerased bit counting operation in step 304 until the number of unerased bits turns to zero or the number of applications of the erasing pulses reaches its maximum.

The erasing operation for a conventional flash EPROM is disclosed with an erasing algorithm in JP-A 02-10596.

The erasing operation on the conventional nonvolatile memory involves applying an erasing voltage to a number of memory cells (bits) at once in a target block to be erased simultaneously. Since all the bits in the target block to be erased are subjected at once to the erasing operation, the distribution of threshold voltages after the erasing operation which is ideally a normal distribution as denoted by (a) in FIG. 4 may be interrupted by various factors in the manufacturing process thus exhibiting irregular groups of bits (b) and (c) off the normal distribution. The bit group (b) is called over erased bits. When the threshold voltage in the memory cells is too low, it may increase leaks during the readout operation from unselected memory cells connected to the common bit lines, whereby the readout current at the memory cells will hardly be determined (erroneous readout). The bit group (c) is called slowly erased bits. The erasing operation in the prior art includes monitoring the number of unerased bits at the erase verification level (reference threshold voltage for verification) or the number of bits higher than the threshold voltage of the erase verification level. When the number of unerased bits turns to zero, the erasing operation is ended. If a group of slowly erased bits (c) exist, an extra number of erasing pulses is applied for decreasing the threshold voltage to lower than the erase verification level. As a result, the threshold voltage will be declined to a much lower level with the ideal normal distribution (a) and the over erased bit group (b) than that where the bit group (c) is absent. This will increase the number of memory cells at lower levels of the threshold voltage, permitting the unselected memory cells to be read out with difficulty due to the occurrence of off-leak currents.

For screening the defective bits (c), the method of the prior art includes presetting the maximum of erasing pulse application time, conducting the erasing operation through a procedure shown in FIG. 3, and discarding as the slowly erased bits unerased bits which are unerased when the pulse application time has exceeded its preset absolute maximum. FIG. 5 illustrates a profile of distribution of the threshold voltages when the maximum number of erasing pulses has been applied.

However, the erasing operation depends largely on and may be disturbed in the characteristics by the effect of variations in the factors at the manufacturing process which include the tunnel oxide layer thickness, the coupling rate of the floating gate, and the threshold voltage at the erasing operation with ultraviolet ray. It will be very difficult for conducting the erasing operation with a margin not to over-kill the normal distribution because the variations declining the accuracy are eliminated only at the area denoted by (d) in FIG. 5. Also, as the width (e) of the distribution of the threshold voltages shown in FIG. 4 is varied during the manufacturing process, it will additionally decline the accuracy.

The method of the prior art includes a sequence of controlling the memory array control circuit provided on a chip form of the memory where the number of unerased bits is counted (examined) whenever the erasing pulses are applied. As the result, the erasing operation will be increased in the time consumption by a length expressed by (the total number of erasing pulses×the time for examining unerased bit number).

SUMMARY OF THE INVENTION

The present invention has been developed in view of the above aspects and its object is to provide a method for setting erasing pulse capable of determining the number of or time for applications of the erasing pulses, which is ideal, in the erasing operation of a nonvolatile memory, for a normal bit varied in the normal distribution after the erasing pulse application in a block to be erased. Also, another object of the present invention is to provide a method for screening erasing defect capable of effectively detecting and subjecting slowly erased bits out of the normal distribution to the screening operation.

For achievement of the first object, the present invention provides a method for setting erasing pulse determining the number of or time for applications of the erasing pulses in a block erasing operation where a target block which consists a plurality of memory cells to be erased in a nonvolatile memory is erased by applying the erasing pulses a plurality of times for erasing its block data together, the method comprising, in the process of applying the erasing pulses the plurality of times: an extraction step of extracting at least two pairs (Np1, Re1) and (Np2, Re2) of the accumulated number of the erasing pulses Np and the ratio Re of the number of erased memory cells in the target block to be erased after the accumulated number of the erasing pulses Np has been applied; a first conversion step of converting the two ratios Re1 and Re2 extracted in the extraction step and defined as two levels of the normal distribution probability into at least two normalized variables S(Re1) and S(Re2) respectively through normalizing the random variables of the normal distribution probabilities with standard deviations; a second conversion step of converting the two accumulated numbers of the erasing pulses Np extracted in the extraction step into common logarithms Log(Np) respectively; a fourth conversion step of converting by the same manner as of the first conversion step the probability or complement (1−1/Nb) of an inverse of the total number of memory cells Nb in the target block to be erased into a normalized variable S(1−1/Nb); an extrapolation step of calculating a common logarithm Log(Nt) through extrapolating an point [Log(Nt), S(T)] including the predetermined target normalized variables S(T) larger than the two normalized variables S(Re1) and S(Re2) from two sets of coordinates [Log(Np1), S(Re1)] and [Log(Np2), S(Re2)] determined in the first and second conversion steps; a third conversion step of converting the common logarithm Log (Nt) determined in the extrapolation step into an extrapolation erasing pulses number Nt; and a determination step of determining the number of or time for applications of the remaining erasing pulses so that the extrapolation erasing pulse number Nt determined in the third conversion step is the target accumulated number of applications of erasing pulses.

Herein, the normal distribution probability is defined by an integral of the probability density function f(x) from negative infinity to a predetermined value z of the random variable in a normal distribution where x is the random variable. The normal distribution probability A(z) when the predetermined random variable is z is calculated from the following equation (1). Hence, the normalized variable S determined by normalizing the random variable z corresponding to the normal distribution probability A(z) with a standard deviation σ is expressed by z/σ or (z−μ)/σ where μ is the average of the normal distribution.

$$A(z) = \int_{-\infty}^{z} f(x)dx \quad (1)$$

The method for setting erasing pulse may further preferably be modified in which a fourth conversion step of calculating the normalized variable S(1−1/Nb) through subjecting a probability (1−1/Nb), which is a complement of an inverse of a total number of memory cells Nb in the target block to the same conversion process as that in the first conversion step; and the normalized variables S(1−1/Nb) determined in the fourth conversion step is used as the target normalized variables S(T) in the extrapolation step.

The method for setting erasing pulse may preferably be modified in which the two ratios Re1 and Re2 determined at the extraction step are arranged so that Re1 ranges from 10% to 60%, Re2 ranges from 40% to 90% and Re1<Re2 is established.

The method for setting erasing pulse may further preferably be modified in which Log(Nt) is calculated with using Log(Nt)={log(Np2)−log(Np1)}/{S(Re2)−S(Re1)}×{S(1−1/Nb)−S(Re1)}+log(Np1) or Log(Nt)={log(Np2)−log(Np1)}/{S(Re2)−S(Re1)}×{S(1−1/Nb)−S(Re2)}+log(Np2) in the extrapolation step.

The method for setting erasing pulse according to the present invention allows, in the erasing operation of the nonvolatile memory, the target block to be erased to be applied with the ideal number of the erasing pulses in the normal distribution excluding abnormal bits such as slowly erased bits. Accordingly, the screening of abnormal bits can thus be conducted at accuracy through the application of the ideal number of erasing pulses. Also, the number of remaining pulses calculated after the application of the ideal number of erasing pulses can be applied at once, thus minimizing the time required for the erase verification to examine the number of erased bits and contributing to the speeding up of the erasing operation.

For achievement of the second object, the present invention also provides a method for screening erasing defect comprising the steps of: performing the erasing pulse setting method according to the present invention; and when the target block to be erased has been applied with the erasing pulses the number of times or the length of time determined in the determination step in the erasing pulse setting method, conducting an erase verification and determining that the memory cell exhibiting the unerased defect represents a defective bit.

The method for screening erasing defect according to the present invention allows any slowly erased bit out of the normal distribution to be effectively detected and subjected to the screening operation.

DETAILED DESCRIPTION OF THE INVENTION

Embodiments of a method for setting erasing pulse and an erasing defect screening method according to the present invention (referred to as a "setting method of the present invention" and a "screening method of the present invention" hereinafter) will be described referring the relevant drawings.

Figure 1:
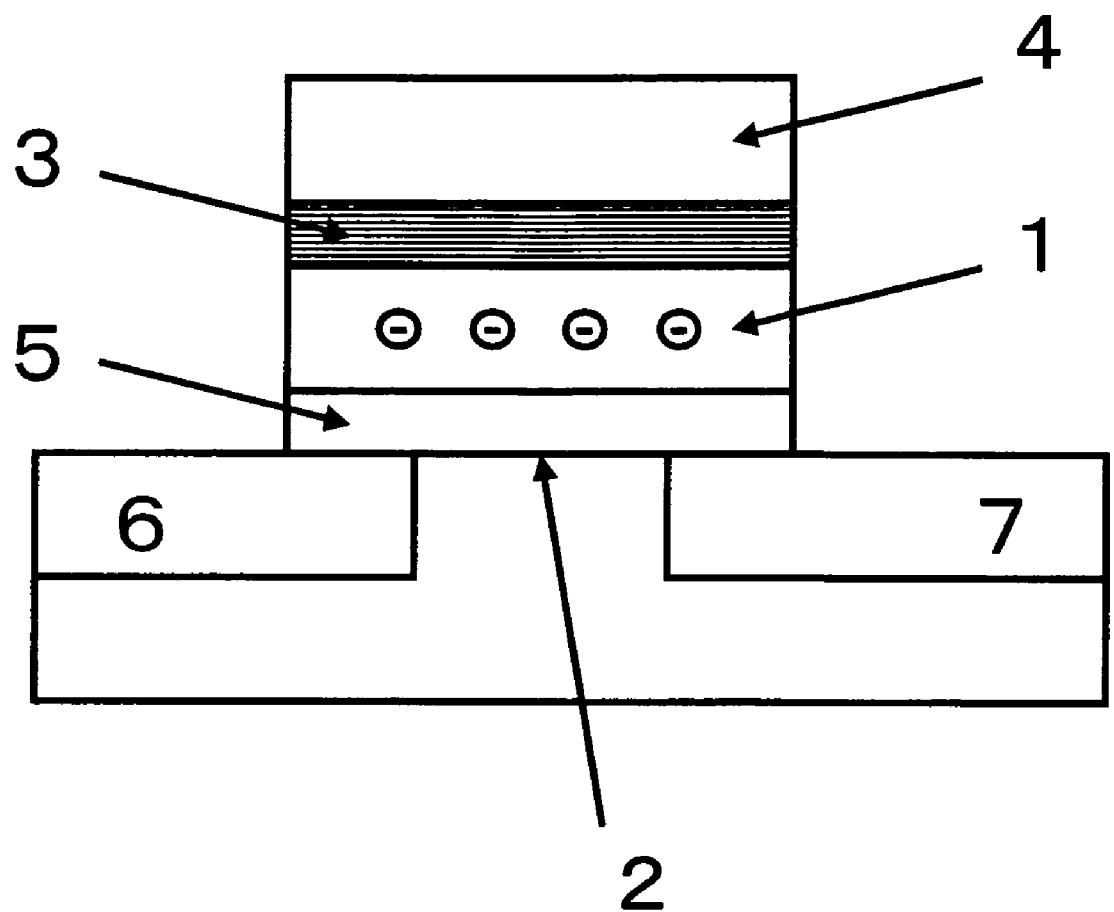
FIG. 1 is an elemental cross sectional view schematically showing a memory cell structure of a conventional flash EPROM.
Figure 2:
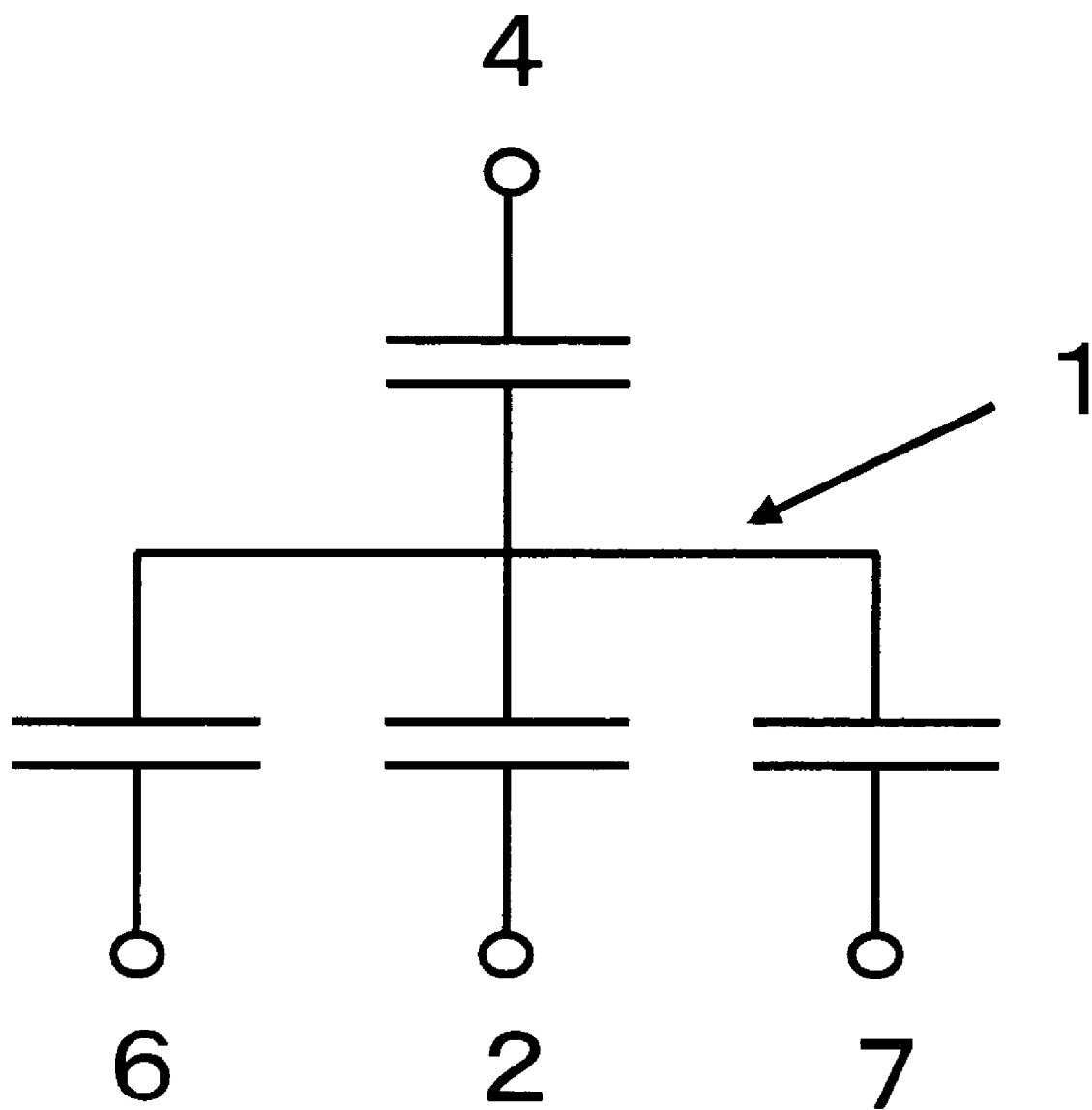
FIG. 2 is an equivalent circuit diagram of the memory cell structure of the conventional flash EEPROM shown in FIG. 1.

A nonvolatile memory subjected to the setting method and the screening method of the present invention comprises, similar to a conventional flash memory, a memory cell array having an array of flash memory cells provided of a memory cell structure identical to that shown in FIG. 1 and a memory array control circuit including an address decoder, a voltage generation circuit, a timing control circuit, a sense amplifier and the like for conducting the memory operations (programming, erasing, reading) on each memory cell in the memory cell array. The erasing operation involves applying erasing pulses plural times to a block of the memory cells to be erased so that electrons can be released from the floating gate across an overlap region of the tunnel oxide layer between the floating gate and the source diffusion in each memory cell by the effect of a mechanism of Fowler-Nordheim tunneling phenomenon. As the result, the block of the memory cells will be erased at once by means of a so-called block erasing technique.

A procedure for the setting method of the present invention and the screening method of the present invention associated with the setting method will now be described referring to a flowchart shown in FIG. 7.

Figure 7:
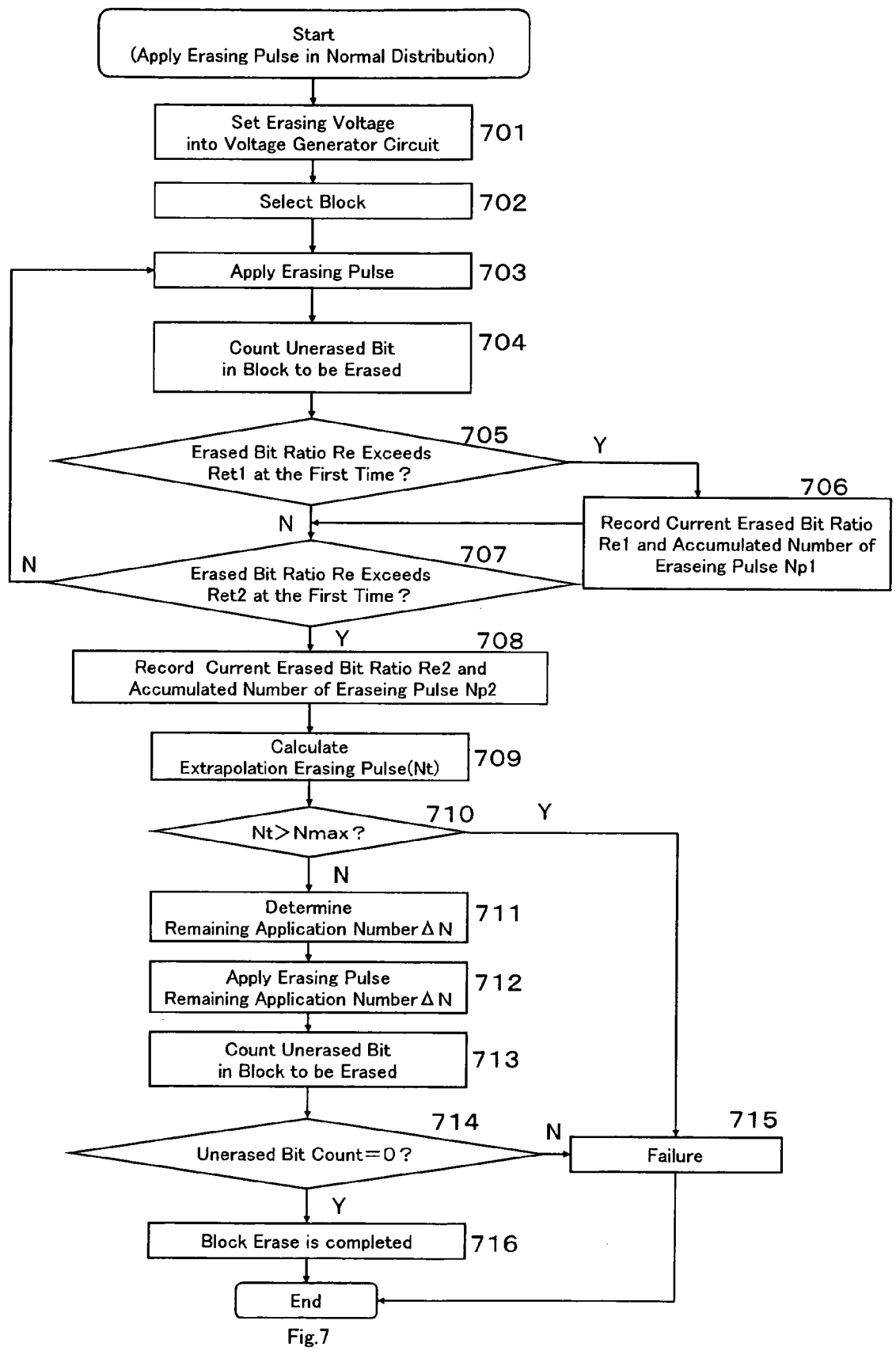
FIG. 7 is a flowchart showing a procedure in one embodiment according to the method for setting erasing pulse and the erasing defect screening method of the present invention.

Prior to starting the procedure shown in FIG. 7, there are determined the accumulated number of erasing pulses Np for predicting the target number of pulses to be used and at least two of the target (erased bit) ratios Ret for monitoring the erased bit ratio Re of the number of erased memory cells to the accumulated number of erasing pulses Np in a target block to be erased. Two or more pairs of the accumulated number of erasing pulses Np and the erased bit ratio Re may guarantee the advantage of the present invention. This embodiment will be described using two pairs of them. It is then assumed that two of the target erased bit ratios Ret are denoted by Ret1 and Ret2. Ret1 is preferably 10% to 60% and more preferably about 50% while Ret2 is preferably 40% to 90% and more preferably about 80%. Also, Ret1<Ret2 is desired.

The procedure starts with setting the erase voltage generation circuit with a voltage condition for conducting the block erasing operation (step 701). Then, a block to be erased is selected (step 702). The block to be erased is applied with the erasing pulses (step 703). Whenever the erasing pulses are applied, the verification for counting erased ones at an erase verification level (the reference voltage for verification) of the memory cells in the block to be erased. The number of erased memory cells is counted (step 704). This number is used as data at the succeeding step for calculating the (erased bit) ratio Re of the erased memory cells or bits. The number may thus be counted not only in memory cells (bits) in the embodiment but also in rows or columns in the memory cell array. Anyway, the unit of the number is not limited, provided that the erased bit ratio is calculated at a predetermined accuracy.

This is followed by examining whether or not the erased bit ratio Re exceeds lower one of the two targets or the target erased bit ratio Ret1 at the first time (step 705). When so, the current erased bit ratio Re1 at the loop and the accumulated number of erasing pulses Np1 at the time are recorded. As the erased bit ratio Re after application of each erasing pulse is a discrete value, the eased bit ratio Re will not always be equal to the target erased bit ratio Ret1 in the loop where the erased bit ratio Re exceeds the target erased bit ratio Ret1 at the first time. For the reason, the current erased bit ratio Re1 and the accumulated number of erasing pulses Np1 at the time are recorded in a pair (step 706, an extraction step).

Similarly, it is examined whether or not the erased bit ratio Re exceeds higher one of the two targets or the target erased bit ratio Ret2 at the first time (step 707). When so, the current erased bit ratio Re2 at the loop and the accumulated number of erasing pulses Np2 at the time are recorded. As the erased bit ratio Re after application of each erasing pulse is a discrete value, the eased bit ratio Re will not always be equal to the target erased bit ratio Ret2 in the loop where the erased bit ratio Re exceeds the target erased bit ratio Ret2 at the first time. For the reason, the current erased bit ratio Re2 and the accumulated number of erasing pulses Np2 at the time are recorded in a pair (step 708, another extraction step).

Figure 4:
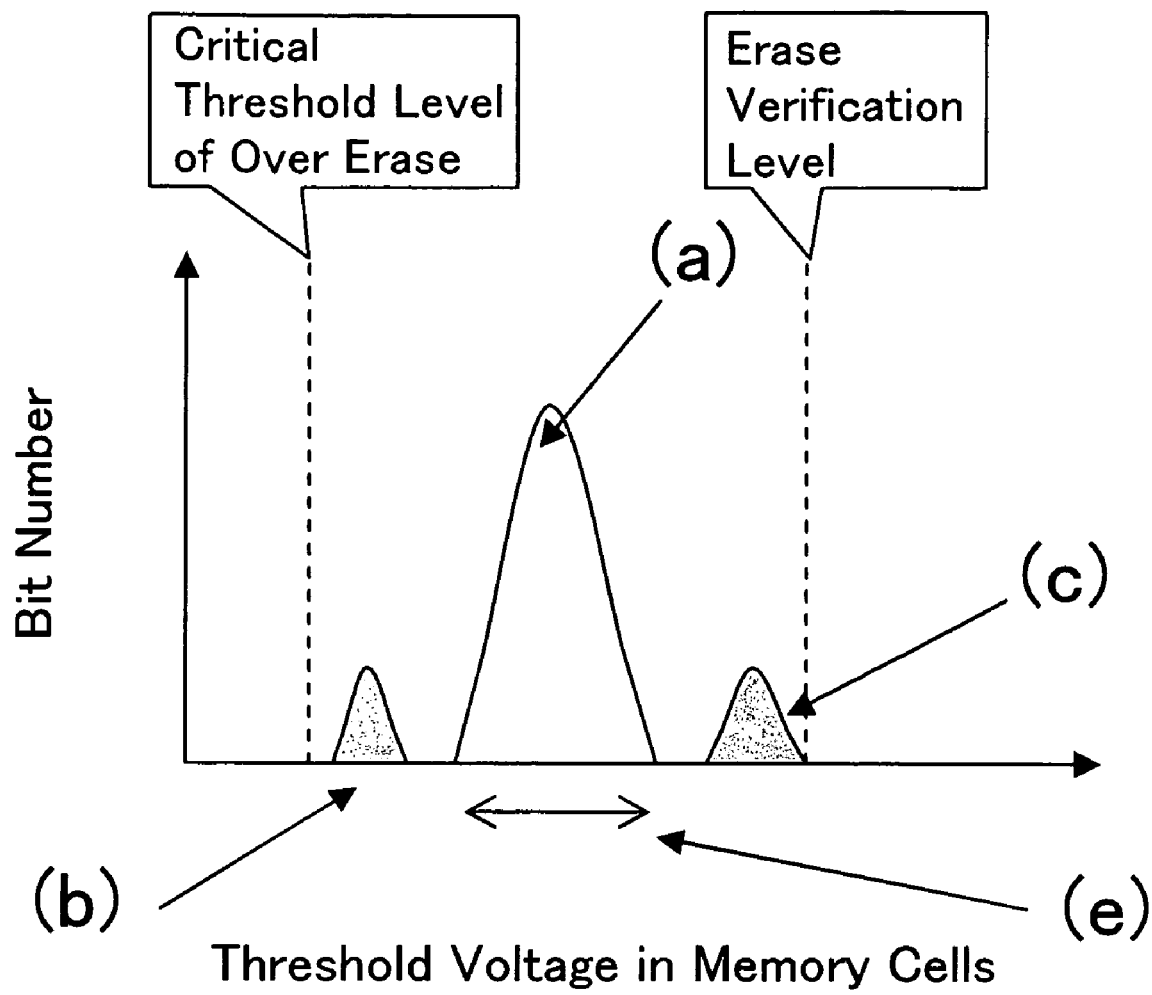
FIG. 4 is a profile of the distribution of threshold voltage in a memory cell in a target block to be erased of the nonvolatile memory after the erasing operation.
Figure 5:
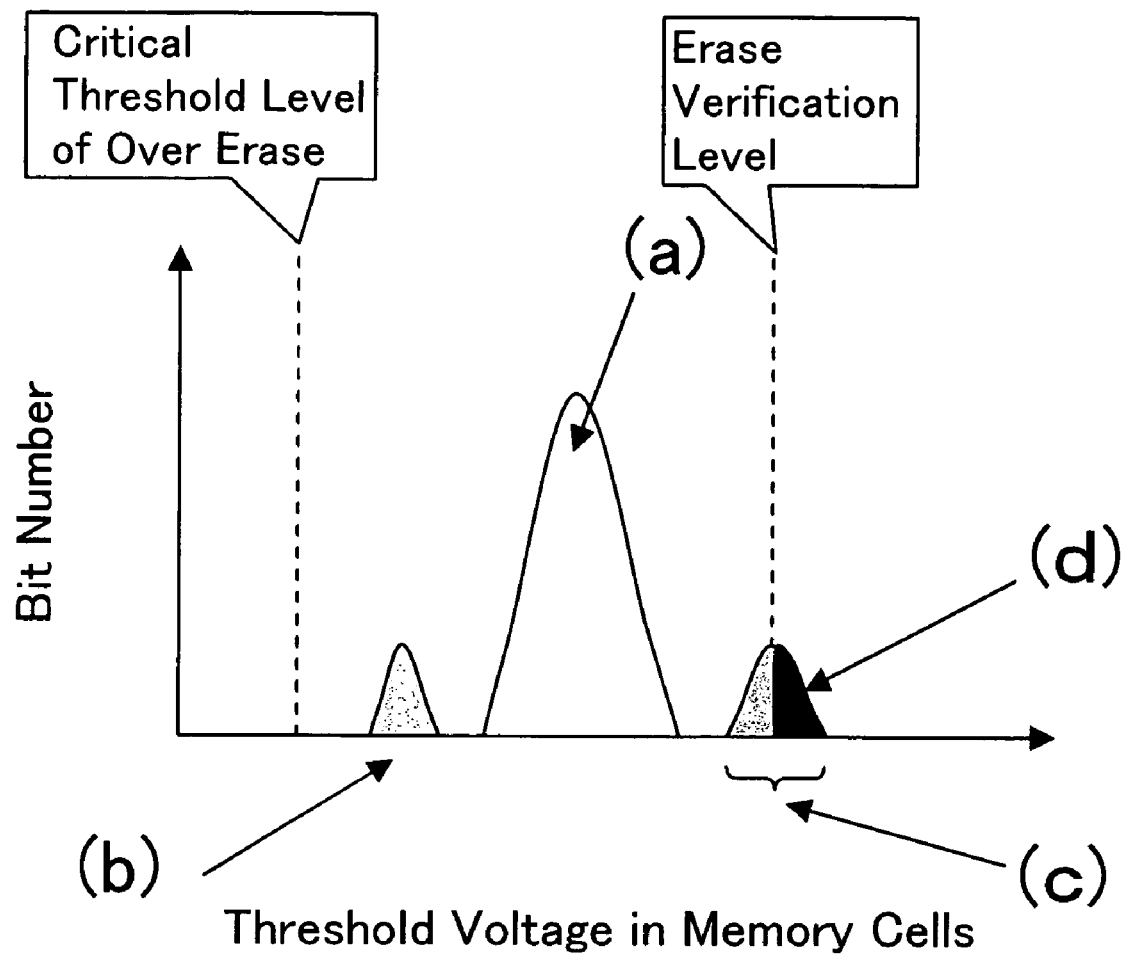
FIG. 5 is a profile of the distribution of threshold voltage in a memory cell in a target block to be erased after the erasing operation of a conventional method for screening slowly erased bits.

After a pair of the current erased bit ratio Re1 and the accumulated number of erasing pulses Np1 and another pair of the current erased bit ratio Re2 and the accumulated number of erasing pulses Np2 are extracted and stored in steps 706 and 708, respectively, the procedure goes to step 709 where the number of erasing pulse applications Nt which is necessary and sufficient for erasing normal bits in the normal distribution area (denoted by (a) in FIG. 4) is calculated by the following manner using the data Re1, Re2, Np1 and Np2 extracted in steps 706 and 708.

At first, the current erased bit ratios Re1 and Re2 of erased memory cells in the target block are converted into normalized variables S(Re1) and S(Re2) respectively in a first conversion step.

The normalized variable S(Re) is equal to a random variable z normalized with the standard deviation σ when the erased bit ratio Re is expressed by a normal distribution probability A(z). Assuming that the standard normal distribution (where the average is 0 and the standard deviation is 1) is g(x), the normalized variable S(Re) is then expressed by a random variable w when the probability B(w) calculated from the following equation (2) is equal to the normal distribution probability A(z). Accordingly, the first conversion step of the embodiment involves having recorded in the form of a table the relationship between the standard normal distribution probability B(w) and the random variable w and extracting as the normalized variable S(Re1) or S(Re2) the random variable w which allows the standard normal distribution probability B(w) to be equal to the erased bit ratio Re1 or Re2.

$$B(w) = \int_{-\infty}^{w} g(x)dx \quad (2)$$

Then, a second conversion step follows for converting the accumulated numbers of erased pulses Np1 and Np2 extracted in steps 706 and 708 into common logarithms Log(Np1) and Log(Np2) respectively.

This is followed by a fourth conversion step of calculating the normalized variable S(1−1/Nb) through subjecting a probability (1−1/Nb), which is the complement of an inverse of the total number of memory cells Nb in the target block to the same conversion process as that in the first conversion step.

Then, an extrapolation step follows where the common logarithm Log(Nt) is calculated through extrapolating from two sets of the coordinate [Log(Np1), S(Re1)] and [Log(Np2), S(Re2)] determined in the first and second conversion step a fourth coordinate [Log(Nt), S(1−1/Nb)] including the normalized variable S(1−1/Nb) determined in the fourth conversion step. More particularly, the common logarithm Log(Nt) is calculated using the following equation (3) or (4), where Nt in the common logarithm Log(Nt) is the accumulated number of erasing pulses (the number of erasing pulse applications) which is necessary and sufficient for completing the erasing of the total number of memory cells less the memory cell Nb in the target block or almost all the memory cells in the normal distribution area (a) of the target block shown in FIG. 4 and will be referred to as an "extrapolation erasing pulse number Nt" hereinafter.

$$Log(Nt) = \frac{Log(Np2) - Log(Np1)}{S(Re2) - S(Re1)} \times \{S(1 - 1/Nb) - S(Re1)\} + Log(Np1) \quad (3)$$

$$Log(Nt) = \frac{Log(Np2) - Log(Np1)}{S(Re2) - S(Re1)} \times \{S(1 - 1/Nb) - S(Re2)\} + Log(Np2) \quad (4)$$

A third conversion step then follows for converting the common logarithm Log(Nt) calculated in the extrapolation step into an extrapolation erasing pulse number Nt. Finally, the number of erasing pulse applications Nt is determined which is necessary and sufficient for erasing the normal bits in the normal distribution area (a) shown in FIG. 4.

Figure 9:
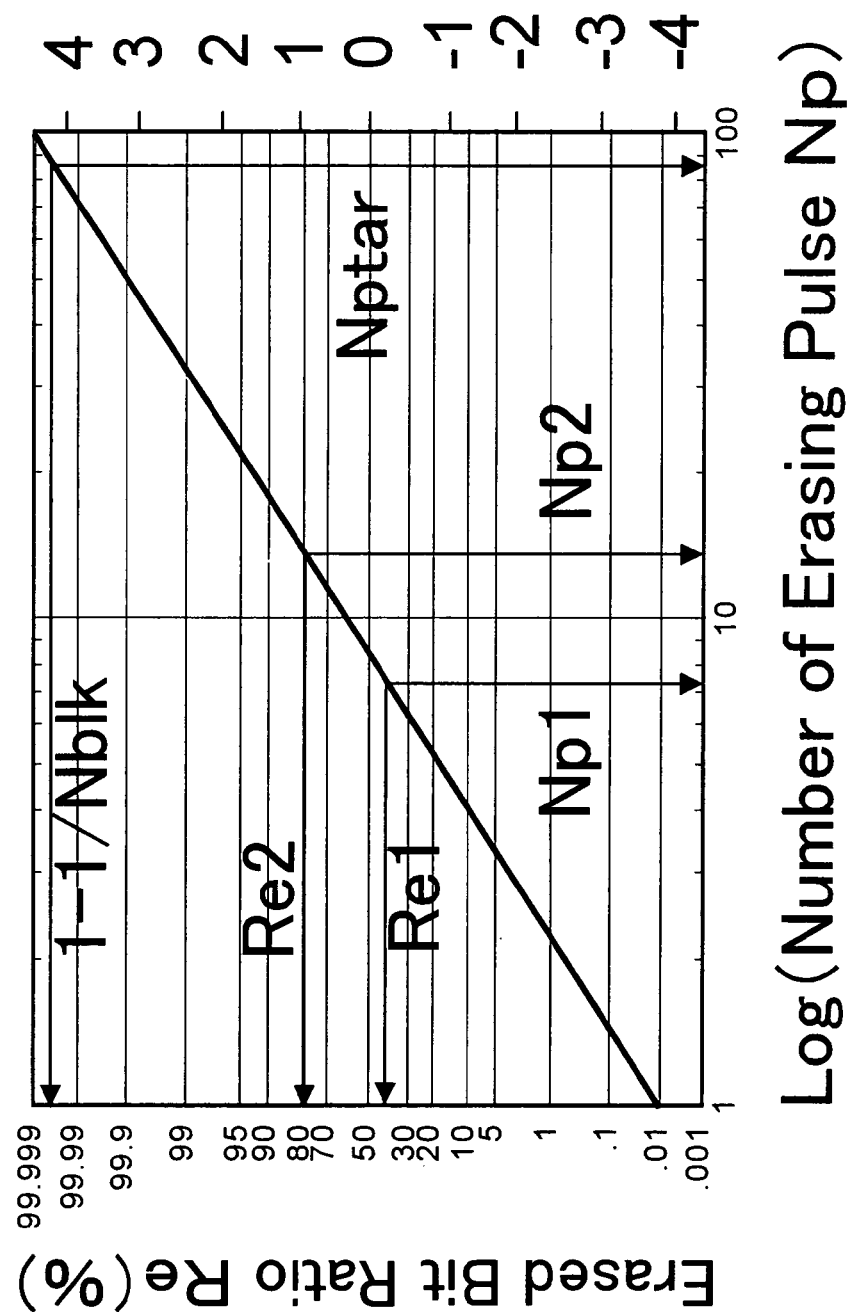
FIG. 9 is a profile showing the relationship between a common logarithm Log(Np) of the number of applications of erasing pulses (the accumulated number of erasing pulses Np) and the ratio of erased bits Re and the linear relationship between the common logarithm Log(Np) and the normalized variable S(Re) representing the erase bit ratio Re.

The calculation of the extrapolation erasing pulse number Nt from the first to third conversion steps in step 709 resides in the fact that the profile of the number of erasing pulse applications (the accumulated number of erasing pulses Np) for erasing the memory cells in the target block is determined by the logarithm normal distribution as shown in FIG. 9. More specifically, the relationship between the common logarithm Log (Np) of the accumulated number of erasing pulses Np and the normalized variable S(Re) to the erased bit ratio Re is linear.

Accordingly, as the accumulated number of erasing pulses Np is determined from the extrapolation to the linear relationship, the target erased bit ratios Ret1 and Ret2 can be calculated at the preceding process so that the two current erased bit ratios Re1 and Re2 extracted in the extraction step of step 708 remain at Re1<Re2 with Re1 ranging from 10% to 60% and Re2 ranging from 40% to 90%. More particularly, it is desired that when the target erased bit ratios Ret1 ranges 10% to 60% and the target erased bit ratios Ret2 ranges 40% to 90%, Ret1<Ret2 is given. As the result, the linear relationship can accurately be provided representing the erasing of the normal bits in the normal distribution area when the erased bit ratio Re ranges from 10% to 90%. Alternatively, when the erased bit ratio Re is less than 10% or 90% or more, data error departing from the linear relationship will be created by the occurrence of error bits called as over erased bits or slowly erased bits out of the normal distribution area. It is hence desired for allowing no failure of accurately establishing the linear relationship to determine the two erased bit ratios Re maintained in a range from 10% to 90% and separated properly from each other.

Figure 10:
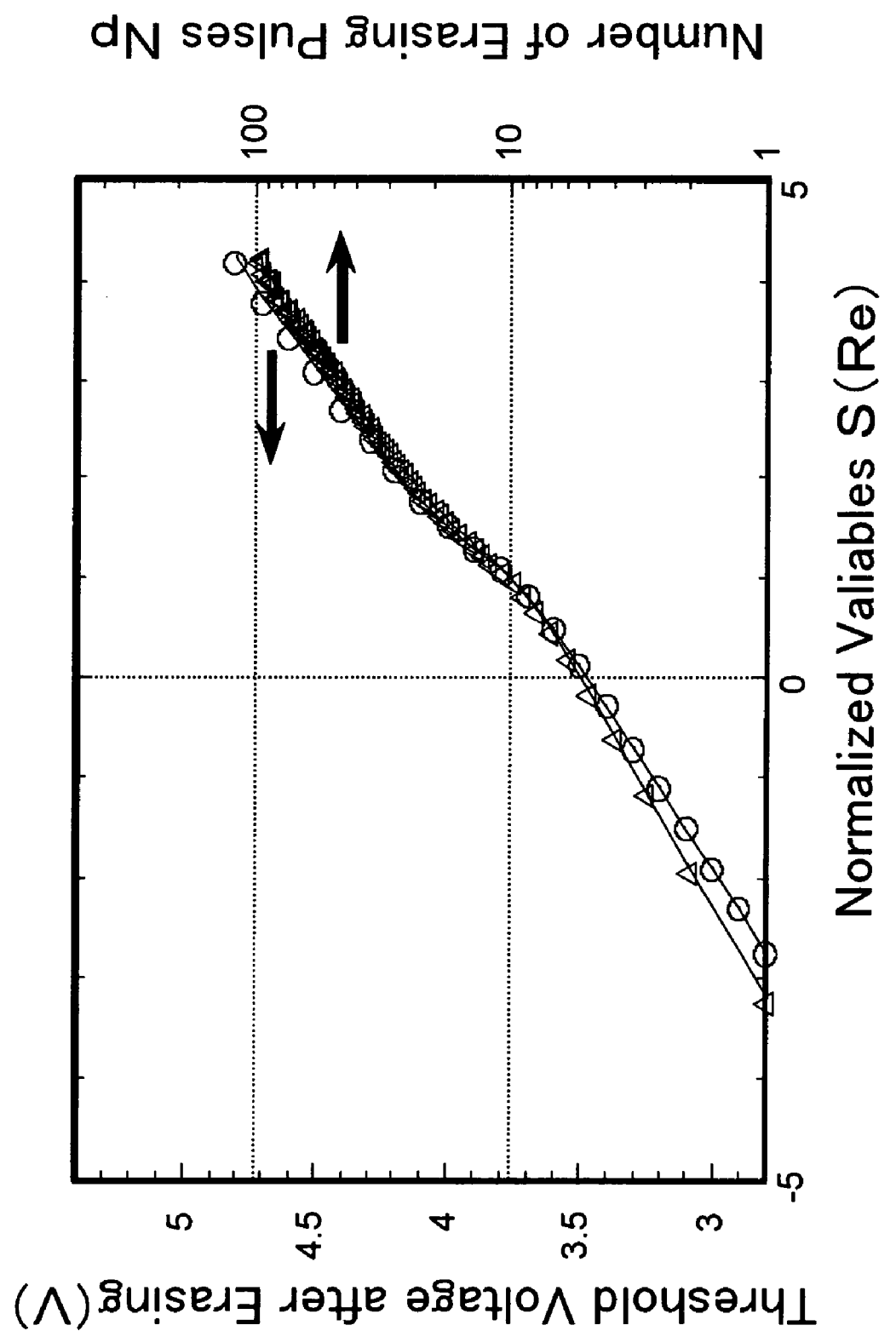
FIG. 10 is a profile showing the relationship of experiments measurements between the threshold voltage after the erasing operation and the normalized variable S(Re) and between the normalized variable S(Re) and the accumulated number of erasing pulses Np.

FIG. 10 illustrates the relationship between the threshold voltage after erasing, which represents the horizontal axis in the normal distribution at the area (a) shown in FIG. 4, and the normalized variable S(Re) equivalent to the random variable when the normal distribution has been converted into a standard normal distribution and the relationship between the normalized variable S(Re) and the accumulated number of erasing pulses Np. As apparent from FIG. 10, the linear relationship shown in FIG. 9 can be proved.

The extrapolation erasing pulse number Nt determined in step 709 represents the ideal number of erasing pulse applications for erasing the common bits in the normal distribution area in the target block to be erased.

Figure 6:
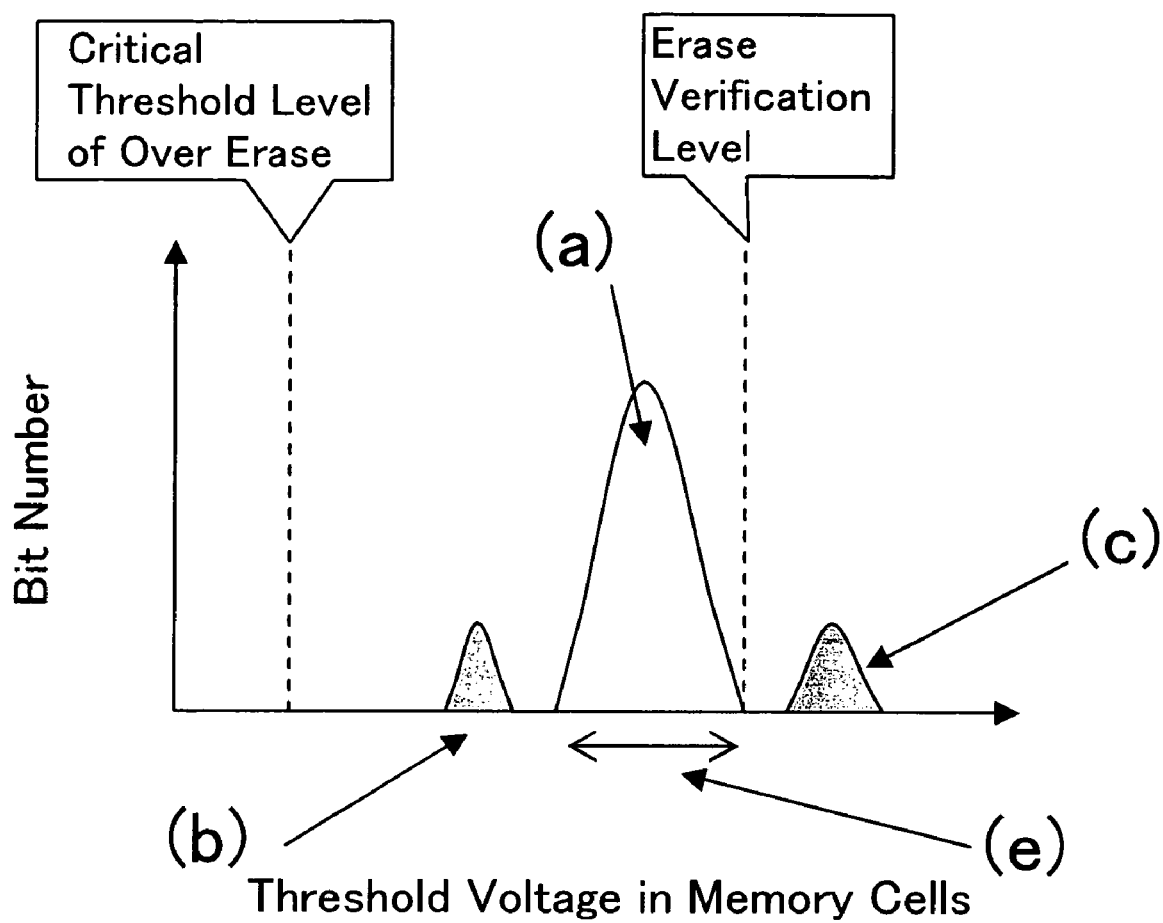
FIG. 6 is a profile of the distribution of threshold voltage in a memory cell in a target block to be erased after the erasing operation of a method for screening erasing defect according to the present invention.

It is further determined whether or not the extrapolation erasing pulse number Nt exceeds a predetermined maximum number of erasing pulse applications Nmax (step 710). When Nt>Nmax, the target block is determined as a defect block (step 715). When Nt≦Nmax, the number ΔN is determined as the number of erasing pulses to be applied to the remaining memory cells in the target block by subtracting the number of applied pulses (e.g., the accumulated number of erasing pulses Np2) from the extrapolation erasing pulse number Nt (step 711, a determination step). Then, the number of erasing pulses ΔN is applied to the target block (step 712). FIG. 6 illustrates a profile of the threshold voltage after the operation of step 712.

The operations from step 701 to step 710 in the setting method of the present invention determine the number of erasing pulses applied to the target block to be erased. Accordingly, the normal bits in the normal distribution area (a), shown in FIG. 4, of the target block excluding the over erased bits (b) and the slowly erased bits (c) can properly be applied with the erasing pulses.

This is followed by verifying the remaining unerased bits (step 713). When the remaining unerased bits are found (NO in step 714), it is determined that the remaining unerased bits are defect slowly erased bits (step 715) and subjected to the screening process. When it is found that the remaining unerased bits are not found (YES in step 714), it is concluded that the target block has entirely been erased (step 716).

Minimizing the erasing time needed for conducting the block erasing operation of the method will be described.

The block erasing operation shown in the flowchart of FIG. 7 includes step 704 in each loop for repeating from step 703 to step 707, where the target block to be erased is read for conducting one operation of the erase verification. Accordingly, before both the erased bit ratio Re2 and the accumulated number of erasing pulses Np2 are determined and recorded in step 708, the operation of erase verification will be repeated at the same times as of the operation of determining the accumulated number of erasing pulses Np2. Then, the erase verification is repeated once in step 713 which follows step 712 where the number of erasing pulses ΔN calculated in step 711 is applied to the remaining cells in the target block (step 712). Accordingly, the total number of the erase verification is Np2+1.

Figure 3:
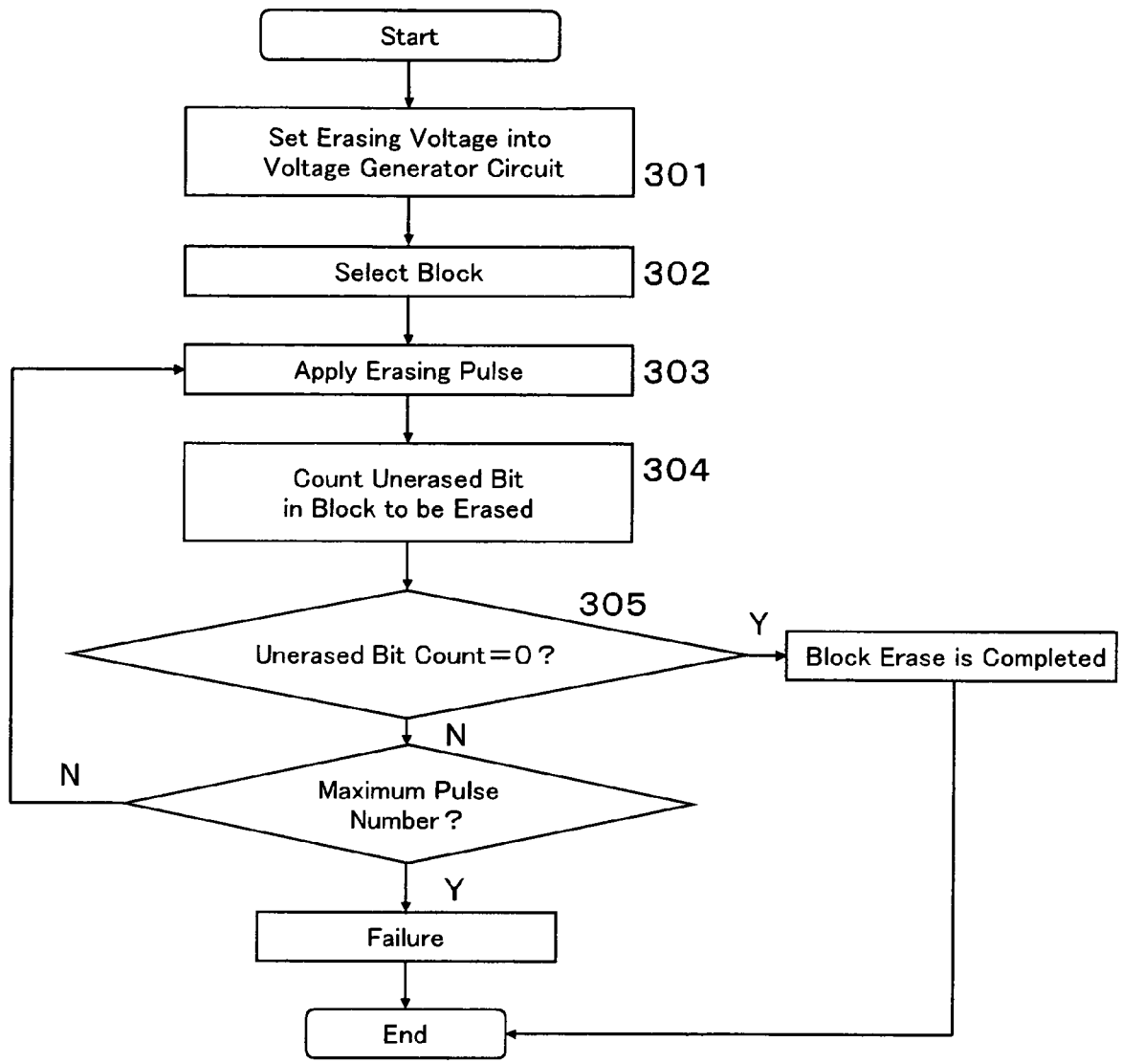
FIG. 3 is a flowchart showing a procedure of the erasing operation in the conventional flash EPROM.

The conventional erasing operation shown in FIG. 3 includes step 304 where the erase verification is conducted once per application of the erasing pulse. The total number of the erase verification in the prior art is equal to the number of erasing pulse applications or greater than Nt and smaller than Nmax determined in the setting method of the present invention. More particularly, the total number is much greater than (Np2+1) in this embodiment. In other words, since the horizontal axis of the profile of the linear relationship shown in FIG. 9 represents the common logarithm of the number of erasing pulses, the accumulated number of erasing pulses Np2 with the erased bit ratio being about 80% in the range from 40% to 90% of the erased bit ratio Re2 can be as small as ten or more times. This is significantly smaller than the extrapolation erasing pulse number Nt (about 90). Also, the erasing pulses from the (Np2+1)-th to the Nt-th can be applied at once through which the erase verification is omitted. As the result, the extra time required for conducting the erase verification will be eliminated and the steps before and after each of the erasing pulse applying operations will be shortened.

Another embodiment of the setting method and the screening method of the present invention will now be described.

As described, the previous embodiment includes the examination for determining the target block to be erased is a defective block when it contains unerased bits or slowly erased bits when the erasing pulses have been applied Nt times. However, the method of the present invention may continue the application of erasing pulses and hold the slowly erased bits not eliminated, similar to the conventional method shown in FIG. 3, when the number of erasing pulses has been counted to Nt until the maximum number of pulse applications Nmax is completed. An alternation of the procedure for the purpose is illustrated in FIG. 8.

Figure 8:
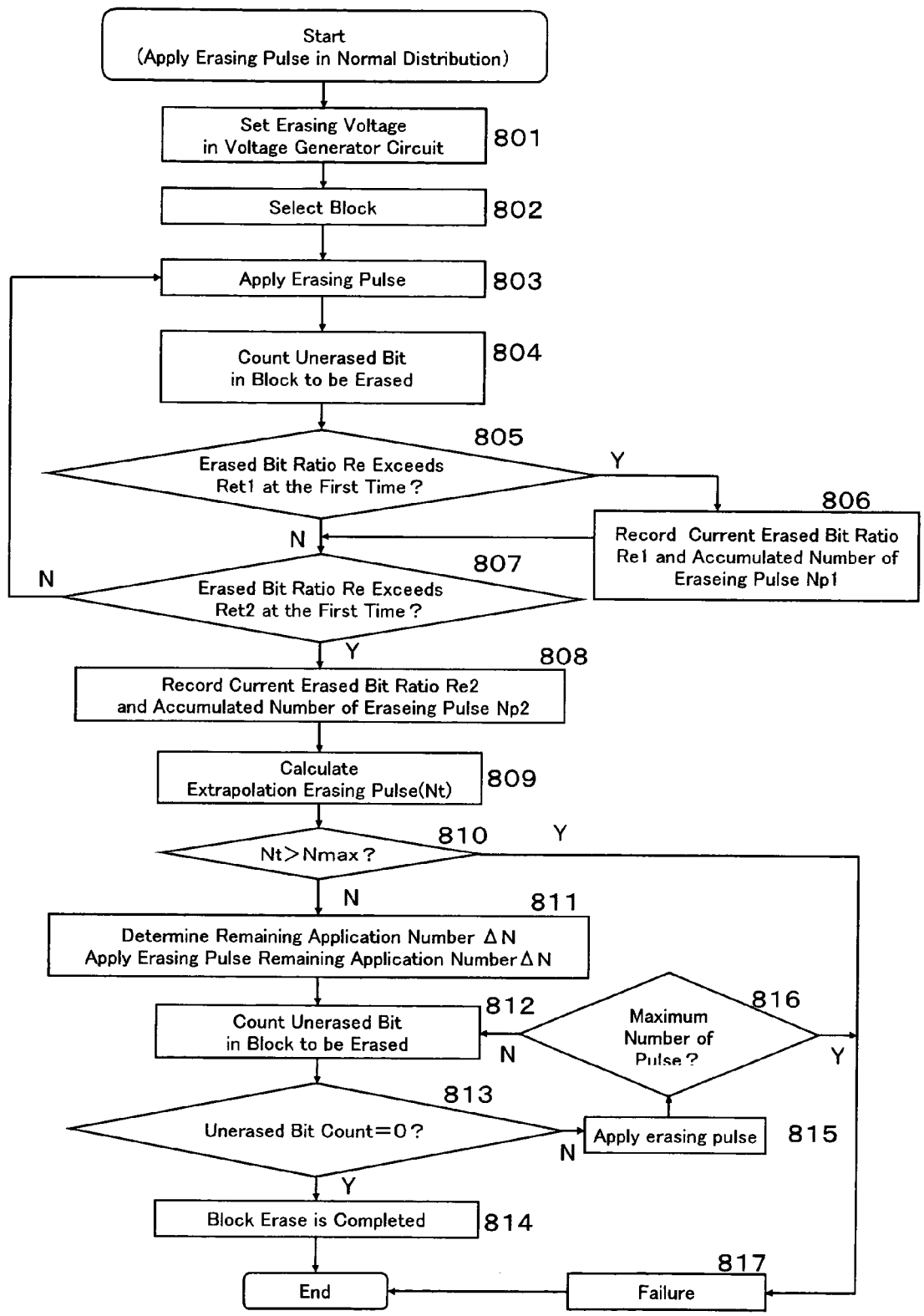
FIG. 8 is a flowchart showing a procedure in another embodiment according to the method for setting erasing pulse and the method for screening erasing defect of the present invention.

Similar to the procedure shown in FIG. 7, before starting the procedure shown in FIG. 8, there are determined the accumulated number of erasing pulses Np for predicting the target number of pulses to be used and at least two of the target (erased bit) ratios Ret for monitoring the erased bit ratio Re of the number of erased memory cells to the accumulated number of erasing pulses Np in a target block to be erased. The actual operation is identical to that of the previous embodiment.

The procedure starts with setting the erase voltage generation circuit with a voltage condition for conducting the block erasing operation (step 801). Then, a block to be erased is selected (step 802). The block to be erased is applied with the erasing pulses (step 803). Whenever the erasing pulses are applied, the verification for counting erased ones at an erase verification level (the reference voltage for verification) of the memory cells in the block. The number of erased memory cells is counted (step 804). The steps are also identical to those of the procedure of the previous embodiment shown in FIG. 7.

This is followed by examining whether or not the erased bit ratio Re exceeds lower one of the two targets or the target erased bit ratio Ret1 at the first time (step 805). When so, the current erased bit ratio Re1 at the loop and the accumulated number of erasing pulses Np1 at the time are recorded. As the erased bit ratio Re after application of each erasing pulse is a discrete value, the eased bit ratio Re will not always be equal to the target erased bit ratio Ret1 in the loop where the erased bit ratio Re exceeds the target erased bit ratio Ret1 at the first time. For the reason, the current erased bit ratio Re1 and the accumulated number of erasing pulses Np1 at the time are recorded in a pair (step 806, an extraction step). Similarly, it is examined whether or not the erased bit ratio Re exceeds higher one of the two targets or the target erased bit ratio Ret2 at the first time (step 807). When so, the current erased bit ratio Re2 at the loop and the accumulated number of erasing pulses Np2 at the time are recorded (step 808, another extraction step). The operations in steps 805 to 808 are also identical to those of the previous procedure shown in FIG. 7.

The procedure then moves to step 809 where the number of erasing pulse applications Nt (the extrapolation erasing pulse number Nt) which is necessary and sufficient for erasing normal bits in the normal distribution area (denoted by (a) in FIG. 4) is calculated by a manner equal to step 709 in FIG. 7 and using the data Re1, Re2, Np1 and Np2 extracted in steps 806 and 808. The operation in step 809 is identical to that of step 709 of the previous embodiment shown in FIG. 7 and will be described in no more detail.

It is further examined whether or not the extrapolation erasing pulse number Nt exceeds a predetermined maximum number of erasing pulse applications Nmax (step 810). When Nt>Nmax, the target block is determined as a defect block (step 817). When Nt≦Nmax, the number ΔN is determined as the number of erasing pulses to be applied to the remaining memory cells in the target block by subtracting the number of applied pulses (e.g., the accumulated number of erasing pulses Np2) from the extrapolation erasing pulse number Nt (step 811, a determination step).

This is followed by subjecting the remaining of unerased bits to the erase verification (step 812). When the remaining unerased bits are not found (YES in step 813), it is determined that the target block has been erased properly (step 814). When the unerased bits remain (NO in step 813), they are applied with the erasing pulses (step 815). It is examined again whether or not the total number of pulse applications reaches the maximum number of pulse applications Nmax (step 816). When the total number of pulse applications is less than the maximum number of pulse applications Nmax, the procedure returns back to step 812 for conducting the erasing examination of unerased bits before repeating the operations after step 813. When the total number of pulse applications reaches the maximum number of pulse applications Nmax, it is determined that slowly erased bits remain after the application of the erasing pulses to the maximum Nmax and the target block is a defect block (step 817).

Similar to the previous embodiment, in step 811, the another embodiment allows the applications of the erasing pulses from (Np2+1)th to Nt-th to be conducted in a sequence thus eliminating extra operations of the erase verification. As the result, the time required for conducting the erase verification and extra steps before and after each of the erasing pulse application will be shortened.

Both the previous embodiment and the another embodiment are described in which the nonvolatile memory is a flash memory having an array of memory cells of which the structure is shown in FIG. 1. However, the setting method and the screening method of the present invention are not limited to the flash memory. The setting method and the screening method of the present invention is applicable with equal success to any nonvolatile memory arranged in which the distribution of physical factors (the threshold voltage in a flash memory) representing the size of stored data in memory cells of the target block to be erased is a normal distribution after the application of erasing pulses plural times for erasing the target block while slowly erased bits out of the normal distribution may be found.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A method for setting erasing pulses by determining the number of or time for applications of the erasing pulses in a block erasing operation where a target block which consists a plurality of memory cells to be erased in a nonvolatile memory is erased by applying the erasing pulses a plurality of times for erasing its block data together, the method comprising, in the process of applying the erasing pulses the plurality of times:

an extraction step of extracting at least two pairs (Np1, Re1) and (Np2, Re2) of the accumulated number of the erasing pulses Np and the ratio Re of the number of erased memory cells in the target block to be erased after the accumulated number of the erasing pulses Np has been applied;

a first conversion step of converting the two ratios Re1 and Re2 extracted in the extraction step and defined as two levels of a normal distribution probability into at least two normalized variables S(Re1) and S(Re2) respectively through normalizing random variables of the normal distribution probabilities with standard deviations;

a second conversion step of converting the two accumulated numbers of the erasing pulses Np extracted in the extraction step into common logarithms Log(Np) respectively;

an extrapolation step of calculating a common logarithm Log(Nt) through a point [Log(Nt), S(T)] including predetermined target normalized variables S(T) larger than the two normalized variables S(Re1) and S(Re2) from two sets of coordinates [Log(Np1), S(Re1)] and [Log(Np2), S(Re2)] determined in the first and second conversion steps;

a third conversion step of converting the common logarithm Log(Nt) determined in the extrapolation step into an extrapolation erasing pulses number Nt; and a determination step of determining the number of or time for applications of the remaining erasing pulses so that the extrapolation erasing pulse number Nt determined in the third conversion step is a target accumulated number of applications of erasing pulses.

2. The method for setting erasing pulse according to claim 1, further comprising;

a fourth conversion step of calculating the normalized variable S(1−1/Nb) through subjecting a probability (1−1/Nb), which is a complement of an inverse of a total number of memory cells Nb in the target block to the same conversion process as that in the first conversion step; wherein the normalized variables S(1−1/Nb) determined in the fourth conversion step is used as the target normalized variables S(T) in the extrapolation step.

3. The method for setting erasing pulses according to claim 1, wherein the two ratios Re1 and Re2 extracted in the extraction step are arranged so that Re1 ranges from 10% to 60%, Re2 ranges from 40% to 90% and Re1<Re2 is established.

4. The method for setting erasing pulses according to claim 1, wherein in the extrapolation step, Log(Nt) is calculated with using Log(Nt)={log(Np2)−log(Np1)}/{S(Re2)−S(Re1)}×{S(1−1/Nb)−S(Re1)}+log(Np1) or Log(Nt)={log(Np2)−log(Np1)}/{S(Re2)−S(Re1)}×{S(1−1/Nb)−S(Re2)}+log(Np2).

5. The method for setting erasing pulses according to claim 1, wherein the memory cell has a structure capable of storing information by amount of carriers, and the information can be erased by applying the erasing pulses to release the carriers from the memory cell.

6. The method for setting erasing pulses according to claim 4, wherein the memory cell has a structure capable of storing information by amount of the number of electrons accumulated between the control gate and the channel region, and the information can be erased by applying the erasing pulses to release the electrons from the memory cell on the basis of a mechanism of Fowler-Nordheim tunneling phenomenon.

7. The method for setting erasing pulses according to claim 1, wherein the predetermined physical quantity of the information stored in the normal memory cell after the erasing pulse application is expressed in a normal distribution.

8. A method for screening erasing defects comprising the steps of:

performing the method for setting erasing pulses according to claim 1; and when the target block to be erased has been applied with the erasing pulses the number of times or the length of time determined in the determination step in the erasing pulse setting method, conducting an erase verification and determining that the memory cell exhibiting an unerased defect represents a defective bit.

* * * * *